(12) United States Patent
Sano

(10) Patent No.: US 11,605,801 B2
(45) Date of Patent: Mar. 14, 2023

(54) ORGANIC LIGHT EMITTING APPARATUS, DISPLAY APPARATUS, IMAGE PICKUP APPARATUS, ELECTRONIC DEVICE, ILLUMINATION APPARATUS, AND MOVING OBJECT

(71) Applicant: CANON KABUSHIKI KAISHA, Tokyo (JP)

(72) Inventor: Hiroaki Sano, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 214 days.

(21) Appl. No.: 17/185,620

(22) Filed: Feb. 25, 2021

(65) Prior Publication Data

US 2021/0273203 A1    Sep. 2, 2021

(30) Foreign Application Priority Data

Feb. 28, 2020 (JP) .............................. JP2020-033818

(51) Int. Cl.
*H01L 51/52* (2006.01)
*H01L 27/32* (2006.01)

(52) U.S. Cl.
CPC ........ *H01L 51/5275* (2013.01); *H01L 27/322* (2013.01); *H01L 27/3234* (2013.01)

(58) Field of Classification Search
CPC ............... H01L 51/5275; H01L 27/322; H01L 27/3234
See application file for complete search history.

(56) References Cited

U.S. PATENT DOCUMENTS

| 9,978,814 B2* | 5/2018 | Jang | ........................ H01L 51/56 |
| 2016/0064694 A1* | 3/2016 | Choi | .................... H01L 51/5275 |
| | | | 257/40 |
| 2018/0351133 A1* | 12/2018 | Yoo | ...................... H01L 51/5275 |
| 2019/0280061 A1 | 9/2019 | Joo | |

FOREIGN PATENT DOCUMENTS

| JP | 2017017013 A | 1/2017 |
| WO | 2019151278 A1 | 8/2019 |

* cited by examiner

*Primary Examiner* — Anne M Hines
(74) *Attorney, Agent, or Firm* — Canon U.S.A., Inc. I.P. Division

(57) ABSTRACT

A light emitting apparatus includes a substrate having a main surface, a first light emitting element and a second light emitting element disposed on the main surface, wherein light emitted from the first light emitting element is emitted from a first area and light emitted from the second light emitting element is emitted from a second area, a first lens into which light emitted from the first area enters, and a second lens into which light emitted from the second area enters. In a direction parallel to the main surface, a distance between a middle point of the second area and a vertex of the second lens is greater than a distance between a middle point of the first area and a vertex of the first lens. The second area is smaller than the first area.

25 Claims, 14 Drawing Sheets

ORGANIC LIGHT EMITTING APPARATUS, DISPLAY APPARATUS, IMAGE PICKUP APPARATUS, ELECTRONIC DEVICE, ILLUMINATION APPARATUS, AND MOVING OBJECT

BACKGROUND

Field of the Disclosure

The present disclosure generally relates to an organic light emitting apparatus having an optical member, such as a microlens, and a display apparatus, image pickup apparatus, electronic device, illumination apparatus, and moving object, each including the organic light emitting apparatus.

Description of the Related Art

An organic light emitting element includes a first electrode, a second electrode, and an organic compound layer disposed between the first electrode and the second electrode. The organic light emitting element is a light emitting device that emits light when carriers are injected from the first electrode and the second electrode. Since an organic light emitting element is a device that is light in weight and can be made flexible, a display apparatus and the like including organic light emitting elements has become a focus of attention in recent years. To provide a high-resolution display apparatus, a system using color filters (CF) and organic light emitting elements that emit white light (hereinafter, referred to as white and CF system) is known. For the white and CF system, an organic layer is formed on the entire substrate, so higher resolution in pixel size, pixel-to-pixel pitch, and the like is relatively easily obtained as compared to a system in which an organic layer is formed for each color by using a metal mask.

International Publication No. 2017/169563 describes that a display apparatus including organic light emitting elements is used with an optical system.

FIG. 14 is a view schematically showing a ray of light from the organic light emitting apparatus to an eye of a user when the organic light emitting apparatus is used with the optical system. When the organic light emitting apparatus 10 is used with the optical system 20 as shown in the drawing, a ray of light heading forward with respect to a display surface is used for a central area located at the central part of a display area. In contrast, light heading obliquely with respect to the display surface is used for a peripheral area located at the peripheral part of the display area, and an image is formed in the eye 30.

In other words, in the organic light emitting elements located in the peripheral area, light that emits at a wide angle from the organic light emitting elements is used, so it is desired to improve the viewing angle characteristics of the organic light emitting elements. International Publication No. 2017/169563 describes a display apparatus that has improved viewing angle characteristics with such an arrangement that the center of a light-emitting surface of a light emitting portion and the center of a color filter are disposed so as to be shifted relative to each other.

However, in a display apparatus including organic light emitting elements, it is known that light having a wide angle of view is difficult to be extracted. This is because such light emitted is totally reflected in part of the organic light emitting elements. Japanese Patent Laid-Open No. 2017-017013 describes a display apparatus having an out-coupling component that reduces such total reflection and that extracts light having a wide angle of view.

The above-described display apparatuses may use energy to produce emission of light that does not contribute to display, so there is room for improvement in reduction of power consumption.

SUMMARY

A light emitting apparatus includes a substrate having a main surface, a first light emitting element and a second light emitting element disposed on the main surface, wherein light emitted from the first light emitting element is emitted from a first area and light emitted from the second light emitting element is emitted from a second area, a first lens into which light emitted from the first area enters, and a second lens into which light emitted from the second area enters. In a direction parallel to the main surface, a distance between a middle point of the second area and a vertex of the second lens is greater than a distance between a middle point of the first area and a vertex of the first lens. The second area is smaller than the first area.

Further features of the present disclosure will become apparent from the following description of exemplary embodiments with reference to the attached drawings.

DESCRIPTION OF THE EMBODIMENTS

Figure 1A:
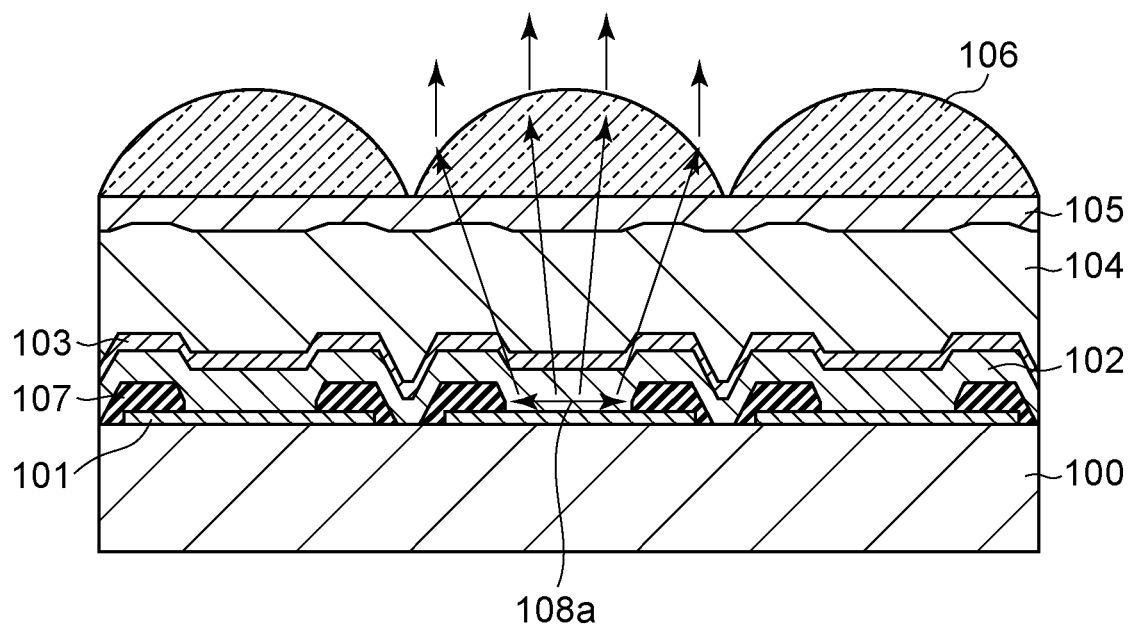
FIG. 1A is a cross-sectional view showing an example of a first light emitting element of a light emitting apparatus according to a first embodiment of the present disclosure.

The display apparatuses described in International Publication No. 2017/169563 and Japanese Patent Laid-Open No. 2017-017013 are capable of using light having a wide angle of view for display. However, the ratio of light that contributes to display to light emitted from the organic light emitting elements emitting light having a wide angle of view is small. In other words, only part of light emitted from the organic light emitting elements that emit light having a wide angle of view from the display apparatus contributes to display. The above-described display apparatuses use energy also to produce emission of light that does not contribute to display, so there is room for improvement in reduction of power consumption.

An aspect of the present disclosure provides a display apparatus that reduces power consumption even when light usage efficiency is improved by using lenses.

A light emitting apparatus according to an embodiment of the present disclosure includes, a substrate having a main surface, a first light emitting element and a second light emitting element disposed on the main surface, wherein light emitted from the first light emitting element is emitted from a first area and light emitted from the second light emitting element is emitted from a second area, a first lens into which light emitted from the first area enters, and a second lens into which light emitted from the second area enters. In a direction parallel to the main surface, a distance between a middle point of the second area and a vertex of the second lens is greater than a distance between a middle point of the first area and a vertex of the first lens. The second area is smaller than the first area.

The second light emitting element may be a light emitting element arranged to emit light at a wide angle of a display apparatus. In the second light emitting element, an optical member is disposed so as to be shifted as compared to the first light emitting element to emit light at a wide angle. In other words, a distance in a cross section, including the lower electrode, the first lens, and the second lens, between a middle point of the second area and a vertex of the second lens is greater than a distance in the cross section between a middle point of the first area and a vertex of the first lens.

In this case, the rate at which the second light emitting element contributes to light emission of the display apparatus is lower than that of the first light emitting element. This is because light emitted from the first light emitting element entirely contributes to light emission of the display apparatus; whereas only part of light emitted from the second light emitting element contributes to light emission of the display apparatus.

To reduce electric power for light emitted, but not contributing to light emission of the display apparatus in the second light emitting element, the second light emitting element has a smaller light emitting area than the first light emitting element. The quantity of light emission of the element reduces for the amount by which the light emitting area is small, but the rate of light emitted and contributing to light emission of the display apparatus increases. As a result, the power consumption of the display apparatus is reduced.

In the specification, a lens may be an optical member, including a microlens. A light emitting layer may be made of an organic compound or may be made of an inorganic compound.

Hereinafter, embodiments will be described with reference to the attached drawings. The following embodiments are not intended to limit the present disclosure. A plurality of components is described in each embodiment; however, not all the plurality of components is indispensable to the disclosure, and the plurality of components may be used in any combination. Like reference signs denote the identical or similar components in the drawings, and the repeated description may be omitted.

For example, in a white and CF system, color filters may be color filters that respectively transmit red light, green light, and blue light. By means of additive color mixture of these subpixels, an organic EL light emitting apparatus is capable of full-color display. In the following embodiments, an example of color filters that respectively transmit three-color lights is described; however, the configuration is not limited thereto.

In the specification, the lens may be provided on a light extraction side of the light emitting apparatus, and the lens may be convex toward the light extraction side. When the light emitting apparatus emits light from both a lower electrode side and an upper electrode side of the light emitting elements, each side may be regarded as a light extraction side.

An array in a plane may be any type of a stripe array, a square array, a delta array, and a Bayer array. By arranging main pixels in a matrix, a light emitting apparatus having a high pixel count is possible.

First Embodiment

Figure 1B:
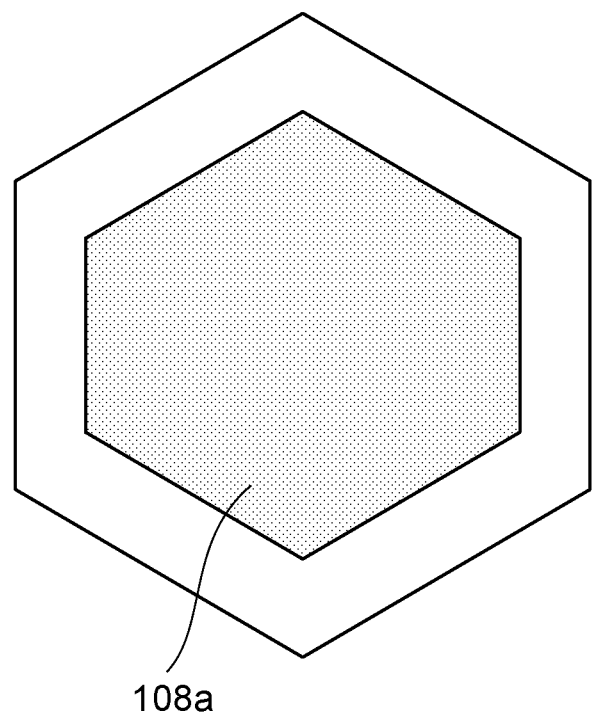
FIG. 1B is a plan view of the first light emitting element in FIG. 1A.

FIG. 1A and FIG. 1B are diagrams showing a first light emitting element of a light emitting apparatus according to a first embodiment of the present disclosure. FIG. 1A is a cross-sectional view of the first light emitting element. FIG. 1B is a plan view of the first light emitting element in FIG. 1A.

The light emitting apparatus of FIG. 1A is made up of a substrate 100, and, on the substrate 100, a lower electrode 101, a functional layer 102 including a light emitting layer, an upper electrode 103, a protective layer 104, a planarizing layer 105, a microlens 106, and an insulating layer 107 covering both ends of the lower electrode 101. The insulating layer 107 is also called a pixel separation film or a bank. The cross-sectional view of FIG. 1A shows a cross section perpendicular to a main surface of the substrate 100. The plan view of FIG. 1B is a plan view when viewed in a direction perpendicular to the main surface of the substrate 100.

The insulating layer 107 is in contact with and covers an end of the lower electrode 101. The functional layer 102 may be in contact with part of the lower electrode 101, with which the insulating layer 107 is not in contact. An area in which the lower electrode 101 and the functional layer 102 are in contact with each other is a light emitting area 108a that emits light by applying an electric field between the lower electrode 101 and the upper electrode 103.

A light emitting area may be determined by viewing, in the same direction of FIG. 1B, the fact that light is emitted during application of an electric field. A light emitting area may be determined by measuring a distance from an end of a first insulating layer covering the left-side end of the lower electrode 101 to an end of a second insulating layer covering a right-side end of the lower electrode 101 in FIG. 1A. The end of the insulating layer 107 may be a contact between the insulating layer 107 and the lower electrode 101.

In FIG. 1B, the light emitting area 108a is surrounded by the insulating layer 107. In other words, the light emitting area 108a may be regarded as an area defined by the insulating layer 107 covering the end of the lower electrode 101. In the present embodiment, the light emitting area 108a has a hexagonal shape. Alternatively, a light emitting area may have another polygonal shape or may have a circular shape. For example, stripe arrangement in which rectangular RGB light emitting areas are arranged to emit light may be adopted.

Figure 2A:
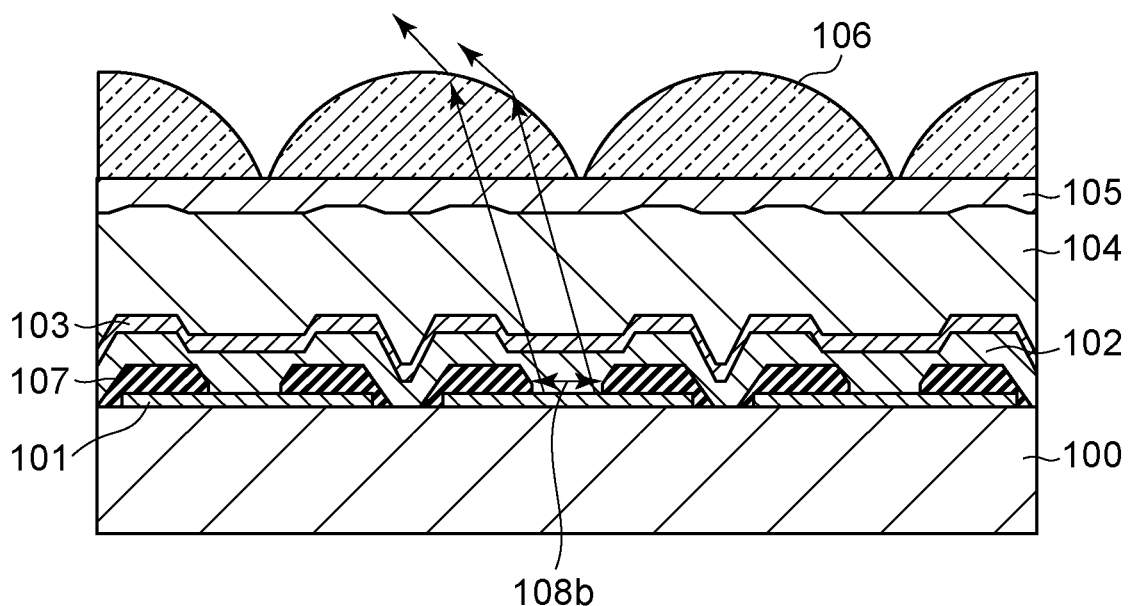
FIG. 2A is a cross-sectional view showing an example of a second light emitting element of the light emitting apparatus according to the first embodiment of the present disclosure.
Figure 2B:
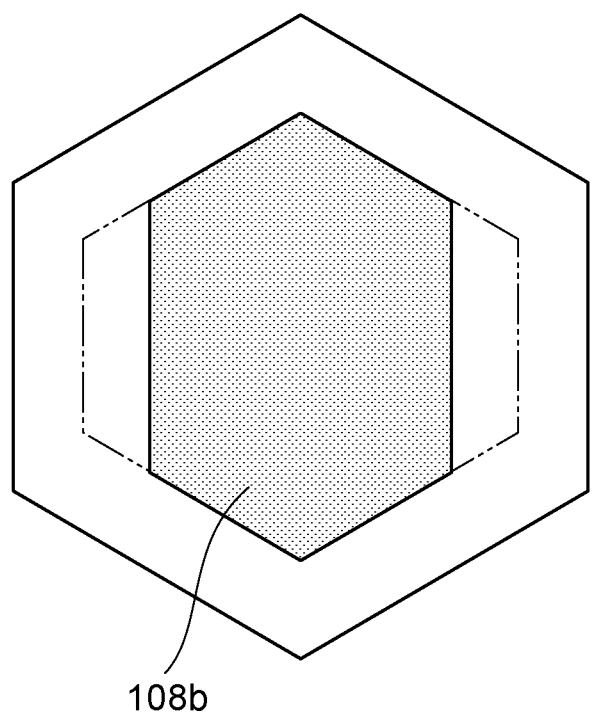
FIG. 2B is a plan view of the second light emitting element in FIG. 2A.

FIG. 2A and FIG. 2B are diagrams showing a second light emitting element of the light emitting apparatus according to the first embodiment of the present disclosure. FIG. 2A is a cross-sectional view of the second light emitting element. FIG. 2B is a plan view of the second light emitting element in FIG. 2A. The cross-sectional view and the plan view are similar to those of FIG. 1A and FIG. 1B.

The second light emitting element has a similar configuration to that of the first light emitting element. In a direction parallel to the main surface of the substrate 100, a distance between the middle point of the light emitting area 108b and the vertex of the microlens 106 in the second light emitting element is greater than a distance between the middle point of the light emitting area 108a and the vertex of the microlens 106 in the first light emitting element. Where the position of the microlens 106 in the first light emitting element is a normal position, it may be regarded that the position of the microlens 106 in the second light emitting element is shifted. It may also be regarded that, in the plan view in the direction perpendicular to the main surface of the substrate 100, a distance between the center of the light emitting area 108b and the vertex of the microlens 106 in the second light emitting element is greater than a distance between the center of the light emitting area 108a and the vertex of the microlens 106 in the first light emitting element. Here, the center of the light emitting area 108a (108b) may be the center of gravity of the outer shape of the light emitting area 108a (108b) or may be the center of gravity of the opening of the insulating layer 107 that defines the light emitting area 108a (108b).

The vertex of the microlens 106 is, in a plane perpendicular to the main surface of the substrate 100, a position farthest from the main surface for a convex lens. The vertex of the microlens 106 is, in a plane perpendicular to the main surface of the substrate 100, a position closest to the main surface for a concave lens. The vertex of a lens may be regarded as the center of the lens in a cross section parallel to the main surface of the substrate 100.

The light emitting area 108b of the second light emitting element is smaller than the light emitting area 108a of the first light emitting element. In other words, the light emitting area 108b in FIG. 2A is shorter in line segment than the light emitting area 108a in FIG. 1A. This may be regarded that an area in which the functional layer 102 is in contact with the lower electrode 101 is small. In the present embodiment, it is desirable that, in addition to the fact that the light emitting area 108b of the second light emitting element is smaller than the light emitting area 108a of the first light emitting element, the following condition be further satisfied. Assuming that a difference (S12−S11) between an area S12 of the lower electrode 101 of the second light emitting element and an area S11 of the lower electrode 101 of the first light emitting element is ΔS1. Assuming that a difference (S22−S21) between an area S22 of a part of the lower electrode 101 of the second light emitting element, covered with the insulating layer 107, and an area S21 of a part of the lower electrode 101 of the first light emitting element, covered with the insulating layer 107, is ΔS2. At this time, it is desirable that ΔS1<ΔS2 hold. In addition, it is desirable that the area of the lower electrode 101 be substantially constant between the first light emitting element and the second light emitting element and an area in which the insulating layer 107 covers the lower electrode 101 be greater in the second light emitting element than in the first light emitting element. In other words, it is desirable that the size of the light emitting area be adjusted by using the area of the insulating layer 107 covering the lower electrode 101. Thus, the lower electrode 101 can be formed in the same shape in each of the light emitting elements, so manufacturing a light emitting apparatus becomes easy. Here, an area or the size of an area is an area or size in plan view in a direction perpendicular to the main surface of the substrate 100.

In this way, power consumption is reduced by reducing the light emitting area 108b of the second light emitting element.

On the other hand, FIG. 2B shows one mode of the light emitting area 108b. In the present embodiment, the right and left two sides of the hexagonal shape of the light emitting area 108b are disposed further toward the center as compared to the light emitting area 108a. In other words, the light emitting area 108b of the second light emitting element has a hexagonal shape, and at least one side of the hexagonal shape is disposed further to the inside as compared to the hexagonal shape of the light emitting area 108a of the first light emitting element. Two sides of the hexagonal shape are a pair of sides opposite each other among the sides of the hexagonal shape.

In the present embodiment, two sides of the hexagonal shape are disposed on the inner side as compared to the hexagonal shape of the light emitting area 108a. At least one side of the polygonal shape is disposed on the inner side as compared to the polygonal shape of the light emitting area 108a of the first light emitting element.

Comparative Example

Figure 3:
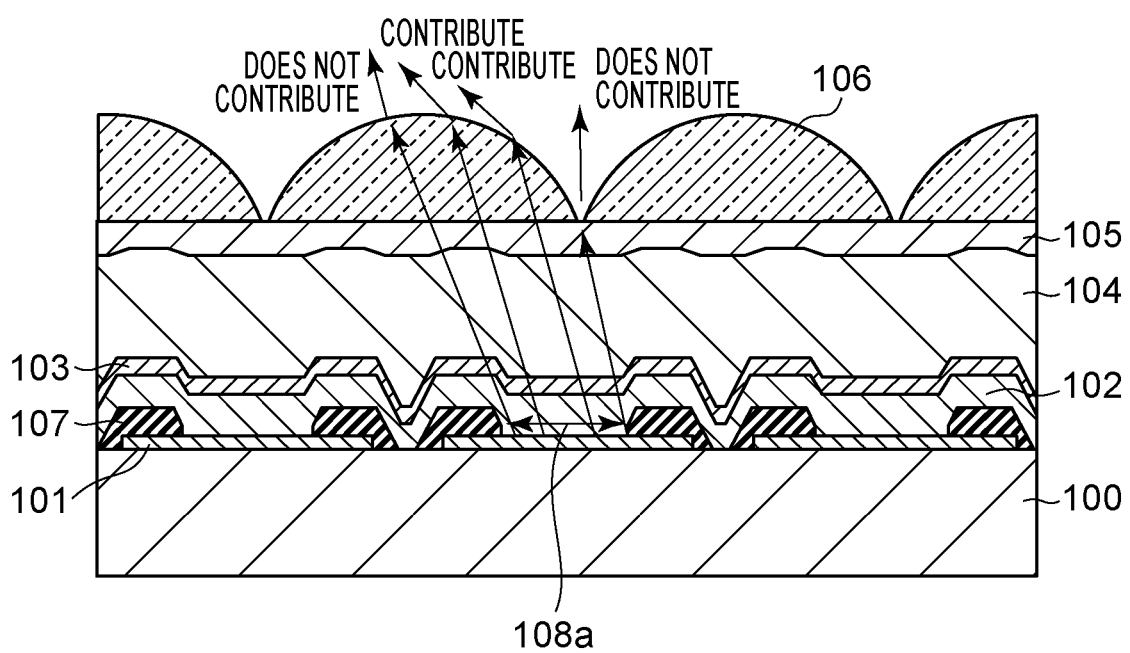
FIG. 3 is a cross-sectional view showing an example of a comparative example.

FIG. 3 is a cross-sectional view showing a comparative example. In the comparative example, the positional relationship between the light emitting area and optical member of the second light emitting element differs from the positional relationship of the first light emitting element, but the light emitting area of the second light emitting element has the same size as the light emitting area of the first light emitting element. The fact that the positional relationship of the optical member in the second light emitting element differs from that of the first light emitting element may be regarded that the optical member is shifted. A direction in which the optical member is shifted may be a direction in which light emitted from a light emitting layer is intended to be refracted.

As shown in FIG. 3, light coming from the end part of the light emitting area 108a is difficult to be refracted to an oblique direction. On the other hand, light coming from the central part of the light emitting area 108a is easy to be refracted to an oblique direction.

Light rays heading toward the left side in the drawing, that is, light rays indicated by "CONTRIBUTE" in the drawing, are light rays that contribute to light emission of a display apparatus. Assuming that the left side in the drawing is a peripheral side of a display area, light heading in an oblique direction with respect to a display surface in a peripheral area located at the peripheral part of the display area is used. The other light rays, that is, light rays indicated by "DOES NOT CONTRIBUTE", in the drawing are light rays that do not contribute to light emission of the display apparatus. Therefore, as in the case of the modes of FIG. 1A to FIG. 2B, described in the first embodiment, light usage efficiency is increased by causing light to be emitted from only the area from which light can be refracted to an oblique direction, so a light emitting apparatus with low power consumption is provided.

Figure 14:
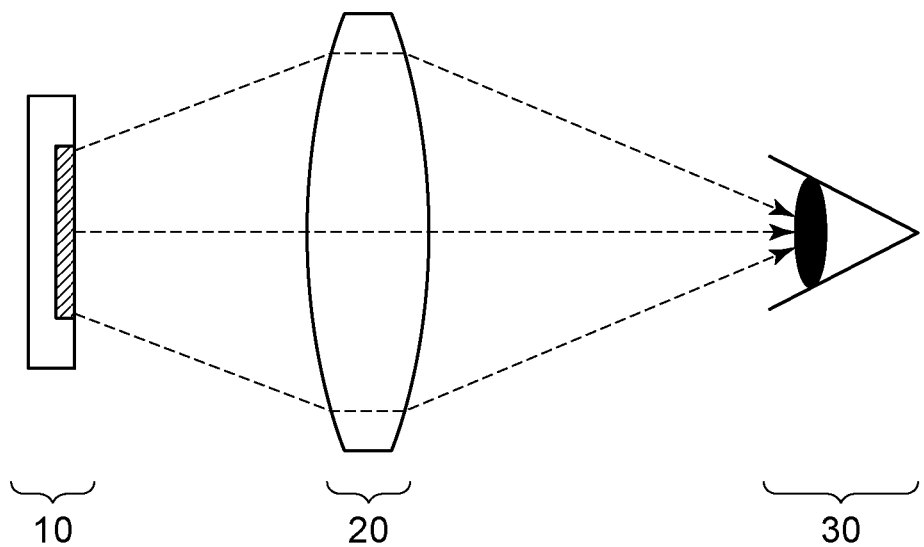
FIG. 14 is a conceptual view showing the relation between a viewer and a display apparatus used with an optical system.

A display apparatus that uses light heading in an oblique direction with respect to the display surface in the peripheral area of the display apparatus is mostly a display apparatus that includes a display unit and an optical system and that a user visually recognizes the display unit through the optical system. In the mode of such a display apparatus, not causing unused light to be emitted further provides the following advantages. For example, when unused light enters the optical system 20 in FIG. 14, the light may be stray light and may degrade display quality. In the above-described embodiment, since light that does not contribute to display is not emitted, it is also advantageous in reducing stray light.

In this way, light emitting areas that contribute less to light emission of the display apparatus are reduced in size as in the case of the second light emitting element. In the present embodiment, the light emitting apparatus including the microlens is described as an example; however, as long as a light emitting area that contributes less to light emission of a display apparatus is adopted, the light emitting area may be reduced in size, and it does not matter whether the optical member, such as the microlens, is provided.

For example, assuming that a light emitting apparatus includes a first light emitting area and a second light emitting area disposed to surround the first light emitting area and light emitting elements included in the second light emitting area contribute less to light emission of the light emitting apparatus, the light emitting area of the light emitting element included in the second light emitting area may be reduced in size. Here, the phrase "disposed to surround the first light emitting area" may be interpreted that "disposed to surround the first light emitting area in plan view in a direction perpendicular to the main surface of the substrate". In other words, the second light emitting area includes a plurality of the second light emitting elements, and the plurality of second light emitting elements is disposed so as to surround the first light emitting element included in the first light emitting area in plan view in a direction perpendicular to the main surface of the substrate.

Since the second light emitting area surrounds the first light emitting area, the second light emitting area includes an area disposed on an outer side in the display apparatus as compared to the first light emitting area. Here, the word "outer" is used to, when a plurality of light emitting elements is disposed on a substrate, call a light emitting element closer to an end of the substrate than another light emitting element as an outer light emitting element.

According to the present embodiment, light emitted from the second light emitting elements efficiently contributes to light emission of the display apparatus, so power consumption is reduced.

Second Embodiment

Figure 4A:
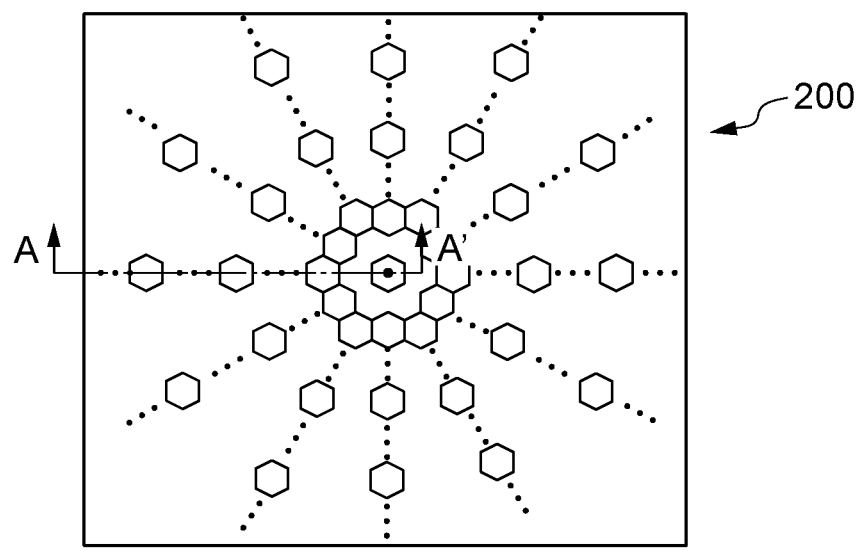
FIG. 4A is a cross-sectional view of a light emitting apparatus according to a second embodiment of the present disclosure.
Figure 4B:
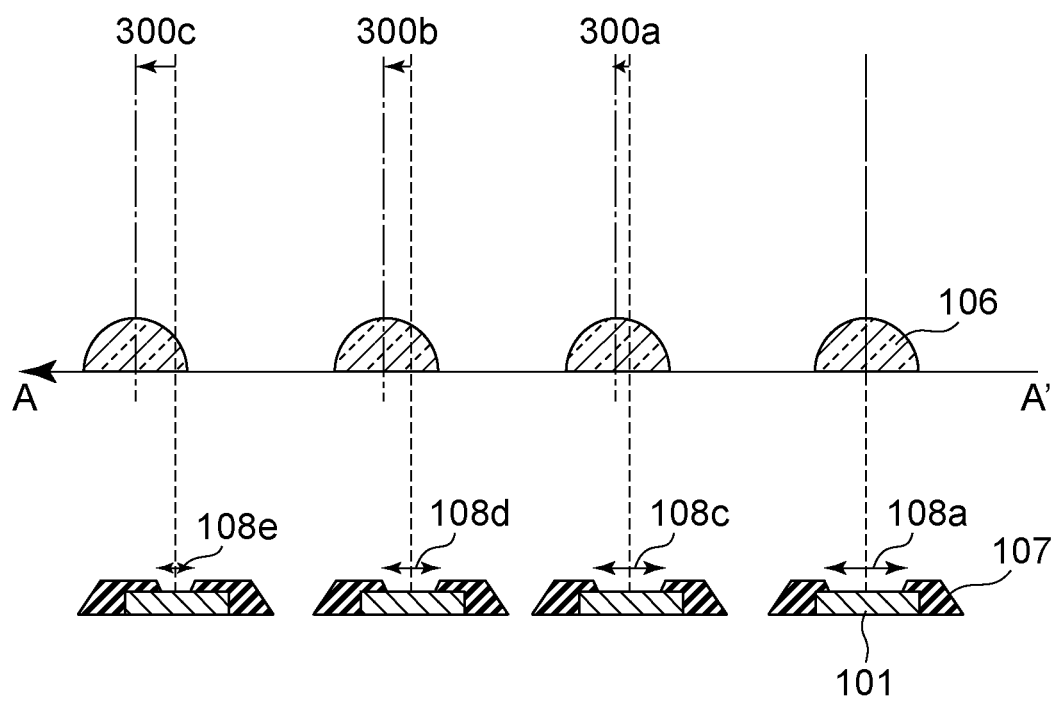
FIG. 4B is a cross-sectional view taken along the line A-A' in FIG. 4A.

FIG. 4A and FIG. 4B are views showing an example of a light emitting apparatus according to a second embodiment of the present disclosure. FIG. 4A is a plan view of the light emitting apparatus in a direction perpendicular to the main surface of the substrate as in the case of FIG. 1B. A display area 200 has a plurality of light emitting elements. The positional relationship between a light emitting area and a microlens will be described by using a central part A' and a peripheral part A.

FIG. 4B is part of a cross-sectional view taken along the line A-A' in FIG. 4A. In cross section, part of light emitting elements are omitted. The positional relationship between a microlens 106 and a light emitting area changes from A' toward A. Specifically, with reference to the positional relationship between a light emitting area 108a and the microlens 106 just above the light emitting area 108a, in the positional relationship between a light emitting area 108c and a microlens just above the light emitting area 108c, the microlens is relatively shifted to the left side in the drawing by a microlens shift amount 300a. The light emitting area 108c is smaller than the light emitting area 108a. Similarly, a light emitting area 108d is smaller than the light emitting area 108c, and a microlens just above the light emitting area 108d is relatively shifted by the amount of microlens shift amount 300b. Furthermore, a light emitting area 108e is smaller than the light emitting area 108d, and a microlens just above the light emitting area 108e is relatively shifted by the amount of microlens shift amount 300c.

In the present embodiment, a first light emitting element has the light emitting area 108a, a second light emitting element has the light emitting area 108c, a third light emitting element has the light emitting area 108d, and a fourth light emitting element has the light emitting area 108e.

Among the light emitting elements, for example, light emitting elements closer to A than A' are outer elements in FIG. 4A. Light emitting elements farther from A' may be regarded as outer light emitting elements.

A mode in which a shift of the microlens continuously increases from the central part A' of the display area toward the peripheral part A may be adopted. When the light emitting area reduces successively or in a stepwise manner, light that does not contribute to light emission of the display apparatus is reduced, so a light emitting apparatus with low power consumption is provided.

Third Embodiment

Figure 5A:
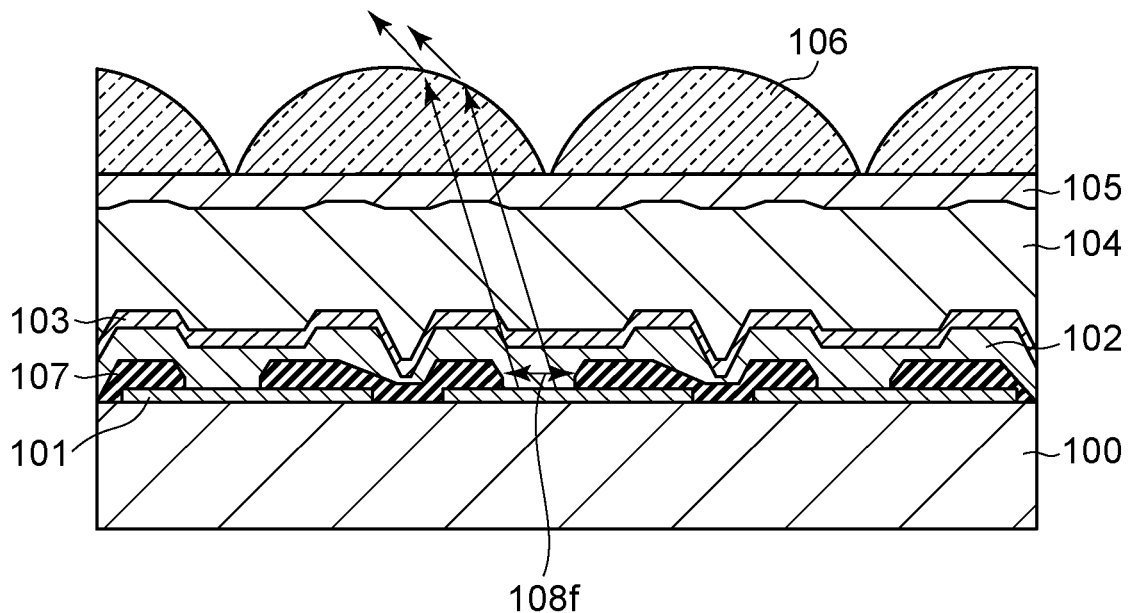
FIG. 5A is a cross-sectional view showing an example of a second light emitting element of a light emitting apparatus according to a third embodiment of the present disclosure.
Figure 5B:
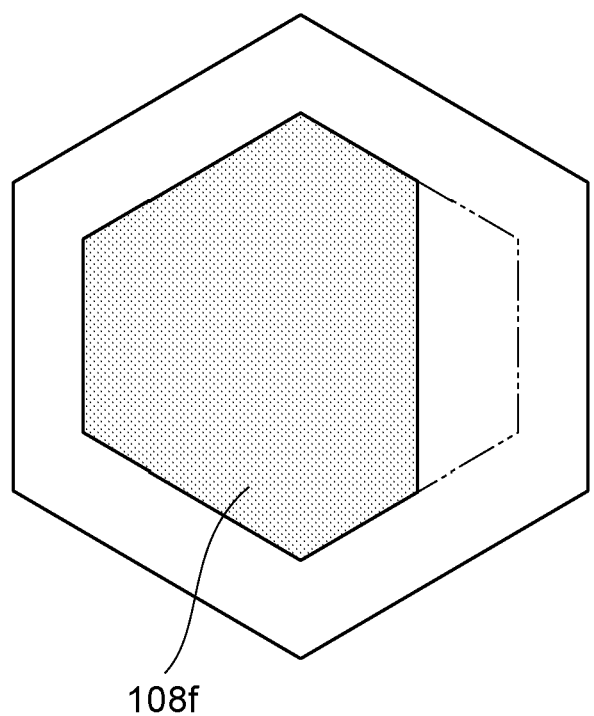
FIG. 5B is a plan view of the second light emitting element in FIG. 5A.

FIG. 5A and FIG. 5B are views showing an example of a light emitting apparatus according to a third embodiment of the present disclosure. FIG. 5A is a cross section perpendicular to the main surface of the substrate as in the case of FIG. 1A. FIG. 5B is a plan view in a direction perpendicular to the main surface of the substrate as in the case of FIG. 1B.

Figure 6A:
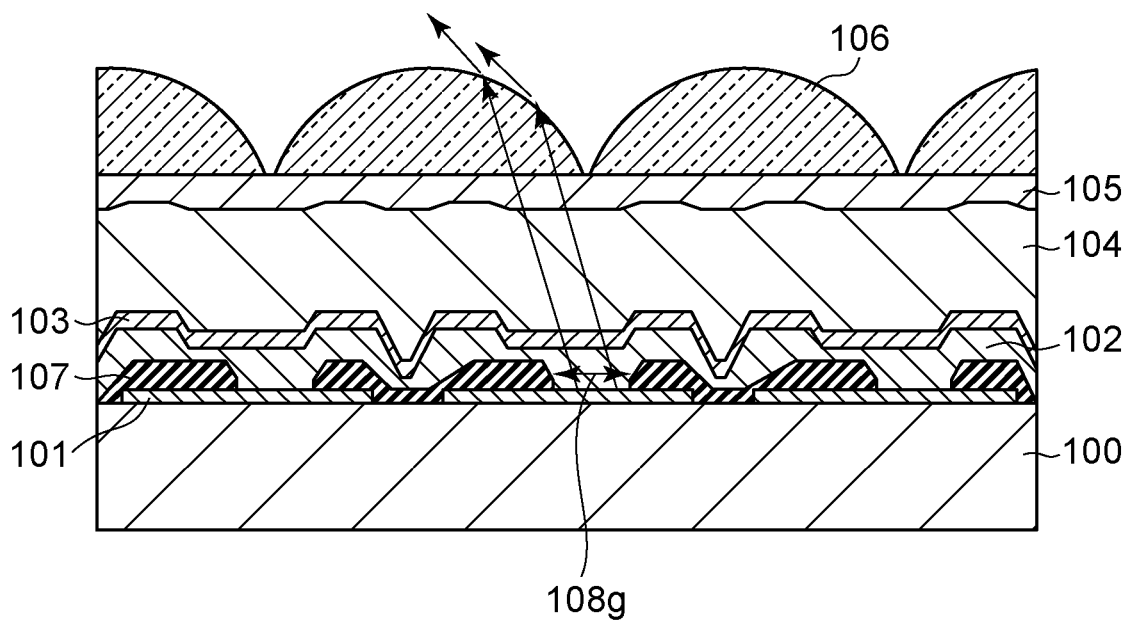
FIG. 6A is a cross-sectional view showing an example of a second light emitting element of the light emitting apparatus according to the third embodiment of the present disclosure.
Figure 6B:
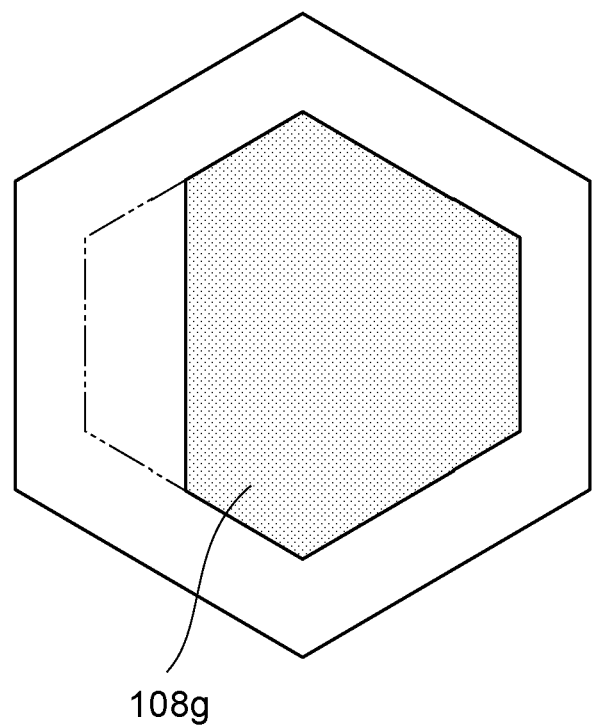
FIG. 6B is a plan view of the second light emitting element in FIG. 5A.

FIG. 6A and FIG. 6B are views showing an example of a light emitting apparatus according to the third embodiment of the present disclosure. FIG. 6A is a cross section perpendicular to the main surface of the substrate as in the case of FIG. 1A. FIG. 6B is a plan view in a direction perpendicular to the main surface of the substrate as in the case of FIG. 1B.

FIG. 5A to FIG. 6B show a configuration in which a light emitting area is smaller than that of a first light emitting element. FIG. 5A and FIG. 5B differ from FIG. 6A and FIG. 6B in that FIG. 5A and FIG. 5B show that the left side of the light emitting area is smaller than that of the light emitting area of the first light emitting element in the drawing; whereas FIG. 6A and FIG. 6B show that the right side is smaller.

In FIG. 5B, a first light emitting element is disposed in the right-side margin of the light emitting element having a light emitting area 108f. In other words, the right-side in the drawing is a center side in a display area. In other words, in the light emitting area of the light emitting element having the light emitting area 108f, the side disposed on an inner side as compared to the hexagonal shape of the light emitting area of the first light emitting element is one of sides of the polygonal shape, and the one of the sides is a side closest to the first light emitting element among the sides of the hexagonal shape.

On the other hand, in the light emitting area of the light emitting element having the light emitting area 108g, the side disposed on an inner side as compared to the hexagonal shape of the light emitting area of the first light emitting element is one of sides of the polygonal shape, and the one of the sides is a side farthest from the first light emitting element among the sides of the hexagonal shape.

In the third embodiment as well, as in the case of the first embodiment, light that does not contribute to light emission of the display apparatus is reduced, so the power consumption of the light emitting apparatus is reduced.

Fourth Embodiment

Figure 7:
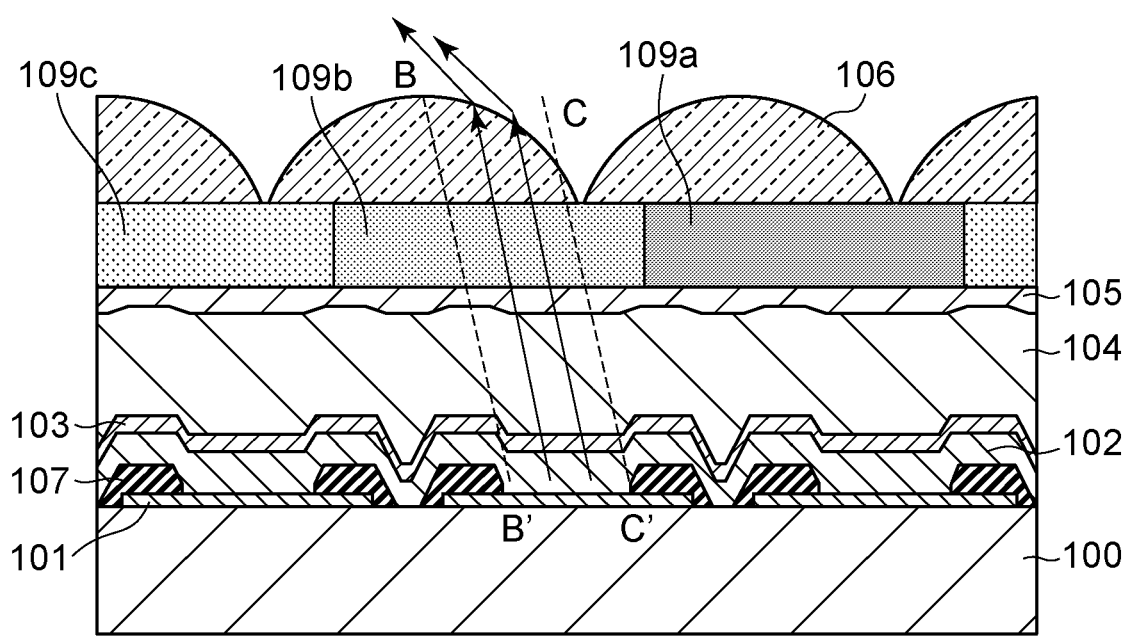
FIG. 7 is a cross-sectional view showing an example of a light emitting apparatus according to a fourth embodiment of the present disclosure.

FIG. 7 is a view showing an example of a light emitting apparatus according to a fourth embodiment of the present disclosure. In addition to the first embodiment, color filters 109a to 109c are disposed on the planarizing layer 105. Pixels respectively including the color filters 109a to 109c are regarded as subpixels, and a set of three subpixels may be regarded as one main pixel. The phrase "a pixel includes a color filter" may mean that light passing through a color filter is light emitted from a light emitting layer of the pixel. Three red, green, and blue colors are particularly desirable for subpixels, and full-color display is possible by means of additive color mixture of these subpixels.

An array of subpixels in a plane may be any type of a stripe array, a square array, a delta array, and a Bayer array. By arranging main pixels in a matrix, a display apparatus having a high pixel count is possible.

Each of the color filters 109a to 109c is also disposed so as to be shifted from the center of the light emitting area 108b as in the case of the microlens 106. At this time, the color filter 109b may be disposed in a line connecting a vertex B of the microlens 106 and an end B', adjacent to the first light emitting element, of the light emitting area.

In addition, the color filter 109b is disposed in a line connecting an end C of the microlens and an end C' of the light emitting area. At least two types of color filters may be disposed in a line segment connecting a vertex of a microlens just above the light emitting area 108b and a light emitting area next to the light emitting area 108b. This is to reduce emission of light emitted from the next light emitting area, through a microlens unintentionally.

Light emitted from the light emitting area 108b passes through the color filter 109b, and light can be refracted to an oblique direction by the microlens 106 and does not pass through the color filters 109a, 109c of the other subpixels, so color purity is increased.

Figure 8:
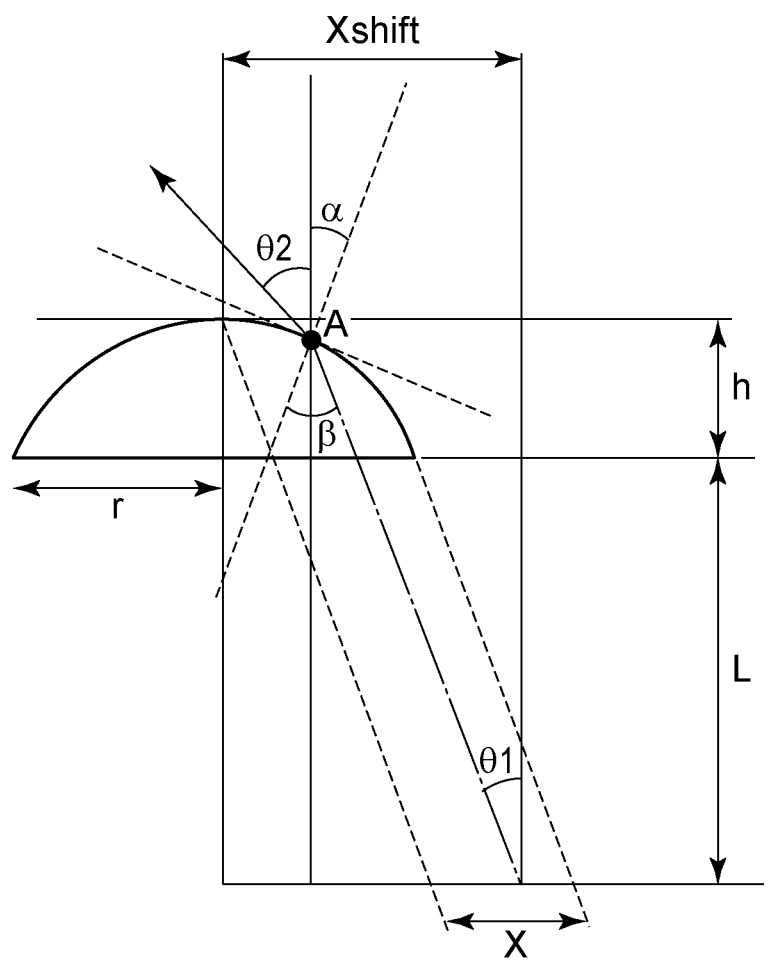
FIG. 8 is a cross-sectional view showing an example of an advantage of the embodiments of the present disclosure.

FIG. 8 is a cross-sectional view showing the relation between a light emitting area 108 and a microlens 106.

In FIG. 8, the microlens 106 having a height of h, a radius of r, and a refractive index of n is formed.

Light is emitted from the light emitting area 108 at an angle $\theta1$ and is refracted at an angle $\theta2$ at point A of the microlens 106. Assuming that the inclination of the microlens with respect to a tangent at point A at this time is an angle $\alpha$. According to Snell's law, the following equation 1 holds. In the drawing, there is a portion where $\alpha+\theta1$ is $\beta$.

$$1 \times \sin(\theta2+\alpha) = n \times \sin(\alpha+\theta1) \qquad (1)$$

When the equation 1 is solved for $\theta1$, $\theta1$ is expressed by the equation 2.

$$\theta1 = \sin^{-1}\{\sin(\theta2+\alpha)/n\} - \alpha \qquad (2)$$

Where the amount of shift of the vertex of the microlens 106 from the center of the light emitting area 108 is Xshift and a distance from the light emitting area 108 to the microlens 106 is L, the size of a light emitting area X is expressed by the following equation 3.

$$X = r - h \times \tan(\theta1) \qquad (3)$$

The size X of the light emitting area 108 is expressed by the equation 4 from the equation 2 and the equation 3.

$$X = r - h \times \tan[\sin^{-1}\{\sin(\theta2+\alpha)/n\} - \alpha] \qquad (4)$$

At this time, the relationship between the angle $\theta1$ of light emitted from the light emitting area 108 and the amount of shift Xshift of the vertex of the microlens 106 from the center of the light emitting area 108 is expressed by the inequality 5.

$$\tan^{-1}(X\text{shift}/h+L) > \theta1 \qquad (5)$$

In calculation through wave optics simulations, the amount of shift of the vertex of the microlens 106 from the center of the light emitting area 108 and the aperture ratio of the light emitting area are obtained as the results shown in Table 1. However, actually, other members such as the protective layer 104 and the color filter 109 are also present between the microlens 106 and the light emitting area 108, and a possible error may occur.

TABLE 1

| Distance between Vertex of Microlens and Center of Light Emitting Area | Aperture Ratio of Light Emitting Area |
| --- | --- |
| 0 μm | 50% |
| 0.5 μm | 46% |
| 1.0 μm | 40% |
| 1.5 μm | 33% |

Other Components in Embodiments

Substrate

In the specification, the substrate 100 is made of a material capable of supporting the lower electrode 101, the functional layer 102, and the upper electrode 103 and is suitably, for example, glass, plastic, silicon, or the like. A plastic may have flexibility. Examples of a substrate having flexibility include resins and organic materials and specifically include polyimide resin, polyacrylic resin, and PMMA. A switching element, such as a transistor, a wire, or an interlayer dielectric film (not shown) may be formed on or in the substrate 100. A plurality of switching elements may be provided in correspondence with a plurality of light emitting elements.

Lower Electrode

The lower electrode 101 may be made of a metal material having a reflectance of visible light of higher than or equal to 50% from the viewpoint of light emission efficiency. Specifically, a metal, such as Al and Ag, or an alloy made by adding Si, Cu, Ni, Nd, Ti, or the like to one of those metals may be used. A reflecting electrode may have a barrier layer on a light output-side surface. The material of the barrier layer may be a metal, such as Ti, W, Mo, and Au, or an alloy of one of the metals, or a transparent conductive oxide, such as ITO and IZO. The lower electrode may be an anode, and, in this case, the upper electrode may be a cathode. On the other hand, when the lower electrode is a cathode, the upper electrode may be an anode.

The case where the lower electrode is a reflecting electrode and the upper electrode is a light extraction electrode is described above. Alternatively, the lower electrode may be a light extraction electrode. When the lower electrode is a light extraction electrode, the lower electrode has translucency as in the case of the upper electrode (described later). Whether the electrode is a lower electrode or an upper electrode is defined depending on a distance from the substrate. The electrode closer to the substrate having a transistor or the like used to control light emission is a lower electrode.

Insulating Layer

The insulating layer 107 is provided so as to cover the end of the lower electrode 101, and an aperture is provided such that part of the lower electrode 101 is exposed. The aperture may be the light emitting area 108. The insulating layer 107 is made of an inorganic material, such as silicon nitride (SiN), silicon oxynitride (SiON), and silicon oxide (SiO). The insulating layer is also called a pixel separation film or a bank.

A known technique, such as a sputtering method and a chemical vapor deposition method (CVD method), may be used to form the insulating layer. Alternatively, the insulating layer 107 may be made of an organic material, such as acrylic resin and polyimide resin.

Functional Layer

The functional layer 102 has a light emitting layer and is disposed on the lower electrode 101. The functional layer 102 can be formed by using a known technique, such as a vapor deposition method and a spin coating method.

The functional layer 102 may be made up of a plurality of layers or may be a laminated body of a plurality of layers. A plurality of layers may include a hole injection layer, a hole transport layer, an electron block layer, a light emitting layer, a hole block layer, an electron transport layer, an electron injection layer, and the like. Another layer, such as a charge generation layer, may be included between these layers.

Holes injected from an anode and electrons injected from a cathode recombine in the light emitting layer to emit light. The functional layer 102 may be an organic layer or may be an inorganic layer.

The light emitting layer may be made up of multiple layers or may be made up of a single layer. When there is a light emitting layer made up of multiple layers, a red light emitting material, a green light emitting material, and a blue light emitting material can be contained in layers of the light emitting layer. White light can be obtained by mixing light emitting colors. Light emitting materials of complementary colors, such as a blue light emitting material and a yellow light emitting material, may be contained in organic layers.

A light emitting material may be a material made of an organic compound or may be a material with quantum dots. When an organic compound is used, the light emitting layer may contain a first material and a second material. The first material is a material that mainly emits light and may be called a dopant or a guest. On the other hand, the second material is a material having a greater ratio by weight in the light emitting layer than the first material and may be called a host. The first material may be a material having a fluoranthene skeleton, a material having a pyrene skeleton, a material having a chrysene skeleton, or a material having an anthracene skeleton. A material having an anthracene skeleton has an anthracene structure in the structure and may be called an anthracene derivative.

The functional layer 102 may be shared by a plurality of pixels. In this case, a light emitting apparatus may be regarded as including a plurality of lower electrodes and a single functional layer. However, the arrangement is not limited thereto. A whole or part of the functional layer 102 may be patterned one by one for each pixel.

Upper Electrode

The upper electrode 103 is disposed on the functional layer 102 and has translucency. The upper electrode 103 may be a translucent material having the property of transmitting part of light reaching its surface and reflecting the other part (that is, translucent reflection property). The material of the upper electrode 103 is, for example, a translucent material composed of a transparent material, such as a transparent conductive oxide, an element metal, such as aluminum, silver, and gold, an alkali metal, such as lithium and cesium, an alkaline earth metal, such as magnesium, calcium, and barium, or an alloy material containing any one of these metal materials.

A translucent material is desirably an alloy mainly containing magnesium or silver. As long as the upper electrode 103 has a desired transmittance, the upper electrode 103 may be a laminate of the above-described materials.

Furthermore, the upper electrode 103 may be disposed over a plurality of pixels.

The case where the upper electrode 103 is a light extraction electrode is described above. Alternatively, the upper electrode 103 may be a reflecting electrode. In this case, as described for the lower electrode 101, the upper electrode 103 may be formed by using a material having a reflection property and illustrated as the material of the lower electrode 101.

A cathode may be made as a top emission element by using an oxide conductive layer made of ITO or the like or may be made as a bottom emission element by using a reflecting electrode made of aluminum (Al) or the like. The arrangement of the cathode is not limited. A method of forming a cathode is not limited. When a direct-current and alternating-current sputtering method or the like is used, the film has a good coverage, and it is easy to reduce the resistance, so it is more desirable.

Protective Layer

The protective layer 104 is formed so as to cover light emitting elements and has translucency. The protective layer 104 desirably contains an inorganic material having a low permeability of oxygen and moisture from the outside. The protective layer 104 may be, specifically, silicon nitride (SiN), silicon oxynitride (SiON), silicon oxide ($SiO_x$), aluminum oxide ($Al_2O_3$), titanium oxide ($TiO_2$), or the like. In terms of protection performance, an inorganic material, that is, SiN, SiON, or $Al_2O_3$, is desirable. A chemical vapor deposition method (CVD method), an atomic layer deposition method (ALD method), or a sputtering method may be used to form the protective layer 104. When the protective layer 104 has sufficient moisture barrier performance, the protective layer 104 may have a single-layer structure or may have a lamination structure obtained by a combination of the above-described materials and formation methods. The protective layer 104 may have a lamination structure of, for example, a layer formed by the ALD method and a layer formed by the sputtering method. Alternatively, the protective layer 104 may have such a structure that a layer formed by the CVD method, a layer formed by the ALD method, and a layer formed by the CVD method are provided in the stated order.

The protective layer 104 may be disposed over a plurality of pixels.

Planarizing Layer

The planarizing layer 105 is disposed on the protective layer 104. The planarizing layer 105 is made of a material having translucency and may be made of any one of an inorganic material and an organic material. The planarizing layer 105 is a layer that reduces irregularities formed on the protective layer 104. When the irregularities formed on the protective layer 104 are small or when the protective layer 104 itself is planarized by, for example, grinding the protective layer 104 itself, the planarizing layer 105 does not need to be provided.

For the planarizing layer 105, a layer disposed between the protective layer 104 and another member may be called a planarizing layer. The planarizing layer 105 may be, specifically, polyvinyl carbazole resin, polycarbonate resin, polyester resin, ABS resin, acrylic resin, polyimide resin, phenolic resin, epoxy resin, silicon resin, urea resin, or the like.

Optical Member

The optical member is formed on the planarizing layer 105. The optical member may be a lens or the like and may be specifically a microlens. The microlens may be a lens with a small diameter. The microlens can be formed by exposure and development process and may be formed by a reflow method, an area coverage modulation method, an etch-back method, or the like. Specifically, a film (photoresist film) made of a material for forming microlenses is formed, and the photoresist film is subjected to exposure and development by using a mask having a continuous coverage modulation. A gray mask or an area coverage modulation mask may be used as such a mask. The area coverage modulation mask enables light irradiation with a continuous tone change on an imaging plane by changing the distribution of dot density made up of a light blocking film with a resolution less than or equal to the resolution of an exposure apparatus.

Alternatively, a lens shape can be adjusted by performing etch back on microlenses formed by exposure and development process.

Alternatively, microlenses caused by surface tension can be formed by patterning and reflowing a resin to fuse and solidify the resin. When an organic layer is used as the functional layer 102, the temperature of reflow process is set to lower than or equal to a predetermined temperature. Lower than or equal to a predetermined temperature is, for example, lower than or equal to 120° C.

At this time, the microlens 106 is not limited to a spherical microlens and may be an aspherical microlens or an asymmetrical microlens.

Color Filter

Color filters may be provided on the protective layer 104. For example, color filters designed in consideration of the size of each light emitting element may be provided on another substrate, and the substrate may be bonded to a substrate on which the light emitting elements are provided. Alternatively, color filters may be patterned on the above-described protective layer 104 by using photolithography. Color filters may be made of a high polymer. Filters that respectively transmit red light, green light, and blue light may be typically used as color filters. In other words, two or more color filters are provided, and a first color filter and a second color filter are filters that respectively transmit lights of wavelengths different from each other. A third color filter that transmits light of a wavelength different from any one of those of the first color filter and the second color filter may be further provided.

When color filters are provided, a planarizing layer may be provided on both upper and lower sides of the color filters, and the materials of the planarizing layers may be the same or may be different from each other. The material of the planarizing layers may be, specifically, polyvinyl carbazole resin, polycarbonate resin, polyester resin, ABS resin, acrylic resin, polyimide resin, phenolic resin, epoxy resin, silicon resin, urea resin, or the like.

Counter Substrate

A counter substrate may be provided on the above-described members. Because the counter substrate is provided at a position so as to face the above-described substrate 100, it is called a counter substrate. The material of the counter substrate may be the same as that of the substrate 100. When the substrate 100 is a first substrate, the counter substrate may be a second substrate.

The light emitting apparatus in the above-described embodiments may be an organic light emitting apparatus of which the functional layer is an organic compound layer.

Uses of Light Emitting Apparatus According to Embodiments of Present Invention

The light emitting apparatuses according to the embodiments of the present disclosure each may be used as a constituent member of a display apparatus or a constituent member of an illumination apparatus. Other than those, there are uses, such as light emitting apparatuses including color filters for an exposure light source of an electrophotographic image forming apparatus and a backlight or white light source of a liquid crystal display apparatus.

A display apparatus may be an image information processing apparatus. The image information processing apparatus includes an image input unit that enters image information from an area CCD, a linear CCD, a memory card, or the like, and an information processing unit that processes input information. The image information processing apparatus displays the input image on a display unit.

A display unit of an image pickup apparatus or ink-jet printer may have a touch panel function. A drive system of the touch panel function may be an infrared radiation system, a capacitance system, a resistive film system, or an electromagnetic induction system and is not limited. A display apparatus may be used as a display unit of a multifunction printer.

Next, a display apparatus according to the present embodiment will be described with reference to the attached drawings.

Figure 9:
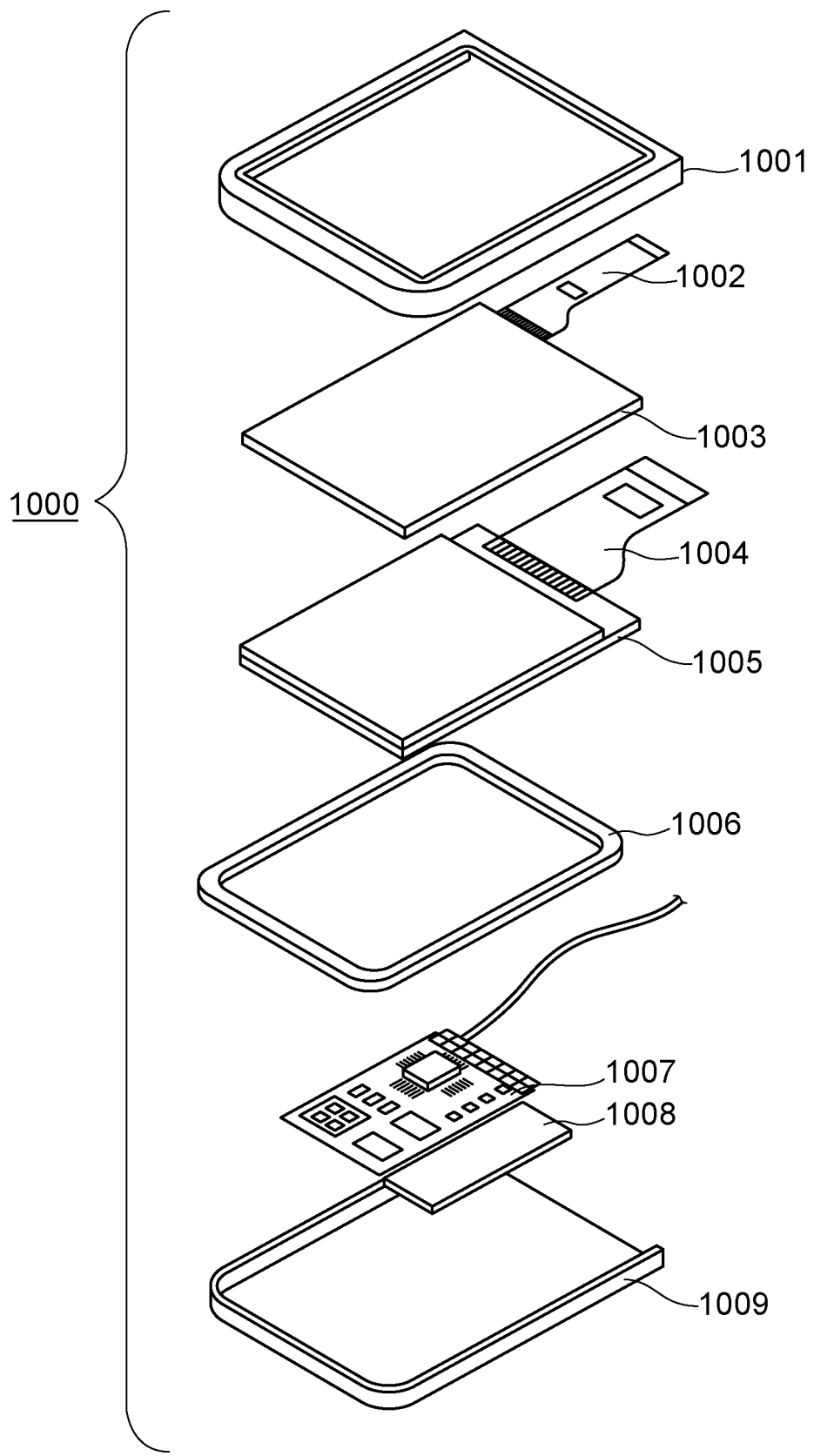
FIG. 9 is a schematic view showing an example of a display apparatus according to an embodiment of the present disclosure.

FIG. 9 is a schematic view showing an example of the display apparatus according to the present embodiment. A display apparatus 1000 may include a touch panel 1003, a display panel 1005, a frame 1006, a circuit board 1007, and a battery 1008 between a top cover 1001 and a bottom cover 1009. A flexible printed circuit (FPC) 1002 is connected to the touch panel 1003. A flexible printed circuit (FPC) 1004 is connected to the display panel 1005. Transistors are provided on or in the circuit board 1007. The battery 1008 does not need to be provided when the display apparatus is not a mobile device, and may be provided at another position when the display apparatus is a mobile device. A control unit that controls display of the display apparatus may be arranged by using the above-described transistors and the like. A known method using a CPU and the like may be used as the control unit. In other words, the display apparatus according to the present embodiment includes a light emitting apparatus and a control unit that controls display of the light emitting apparatus. The display apparatus may be an active matrix display apparatus.

The display apparatus according to the present embodiment may include red, green, and blue color filters. The red, green, and blue color filters may be disposed in a delta array or in a stripe array.

The display apparatus according to the present embodiment may be used in a display unit of a mobile terminal. In this case, the display apparatus may have a display function and an operating function. The mobile terminal may be a cellular phone, such as a smartphone, a tablet, a head mounted display, or the like. When used in the display unit, the display apparatus may be used with a magnification optical system.

The display apparatus according to the present embodiment may be used in a display unit of an image pickup apparatus including an optical unit having a plurality of lenses and an image pickup device that receives light passing through the optical unit. The image pickup apparatus may include a display unit that displays information acquired by the image pickup device. The display unit may be a display unit exposed to the outside of the image pickup apparatus or may be a display unit disposed in a viewfinder. The image pickup apparatus may be a digital still camera or a digital camcorder.

Figure 10A:
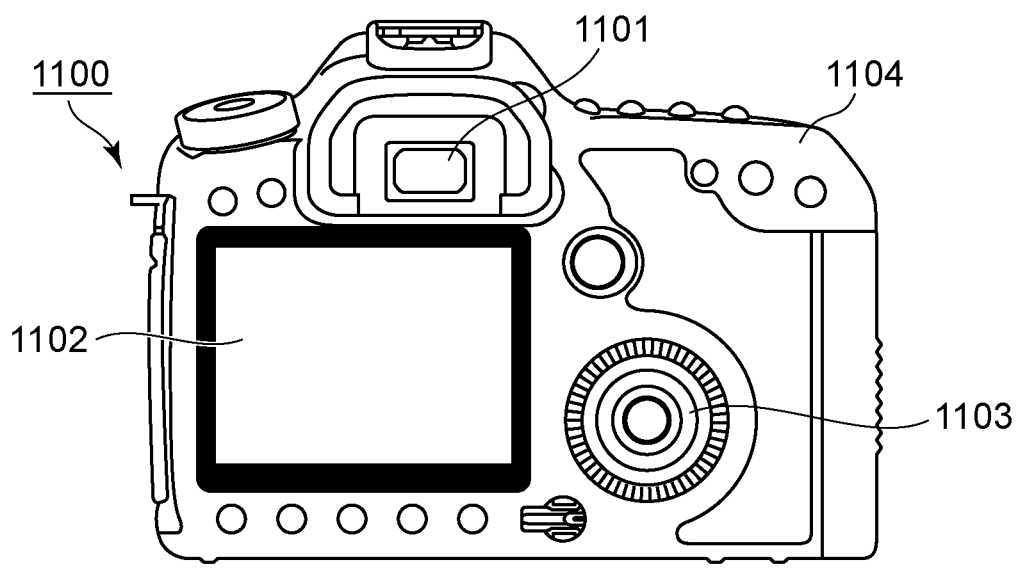
FIG. 10A is a schematic view showing an example of an image pickup apparatus according to an embodiment of the present disclosure.

FIG. 10A is a schematic view showing an example of an image pickup apparatus according to the present embodiment. An image pickup apparatus 1100 may include a viewfinder 1101, a back display 1102, an operating unit 1103, and a housing 1104. The viewfinder 1101 may include the display apparatus according to the present embodiment. In this case, the display apparatus is not limited to displaying only an image to be picked up and may display environmental information, an image pickup instruction, or the like. The environmental information may include the intensity of external light, the direction of external light, the moving speed of an object, a possibility that a subject is shielded by a shielding material, or the like.

Since suitable timing for image pickup is a slight amount of time, information is desirably displayed as early as possible. Therefore, among display apparatuses using the light emitting apparatuses according to the embodiments of the present disclosure, an organic light emitting apparatus is desirably used. This is because an organic light emitting element has a higher response speed. The display apparatus using organic light emitting elements is more suitably used than a liquid crystal display apparatus for these apparatuses of which a higher display speed is desired.

The image pickup apparatus 1100 includes an optical unit (not shown). The optical unit has a plurality of lenses and forms an image on the image pickup device accommodated in the housing 1104. The plurality of lenses is capable of adjusting a focal point by adjusting the relative positions of the lenses. This operation can be automatically performed. The image pickup apparatus may be called a photoelectric conversion apparatus. The photoelectric conversion apparatus can include not sequentially picking up an image but a method of detecting a difference from a previous image, a method of extracting an image from an image being constantly recorded, or the like, as a method of picking up an image.

Figure 10B:
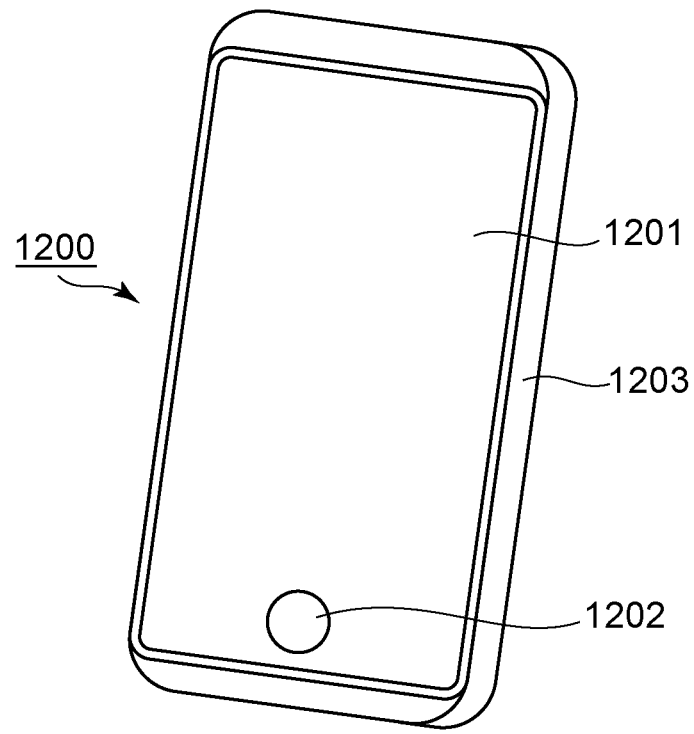
FIG. 10B is a schematic view showing an example of an electronic device according to an embodiment of the present disclosure.

FIG. 10B is a schematic view showing an example of an electronic device according to the present embodiment. An electronic device 1200 includes a display unit 1201, an operating unit 1202, and a housing 1203. The housing 1203 may contain a circuit, a printed board having the circuit, a battery, and a communication unit. The operating unit 1202 may be a button or may be a touch panel-type response unit. The operating unit may be a biometric authentication unit that identifies a fingerprint to, for example, release a lock. The electronic device including a communication unit may be regarded as a communication device. The electronic device may further have a camera function by including a lens and an image pickup device. An image picked up by the camera function is shown on the display unit. The electronic device may be a smartphone, a notebook computer, or the like.

Figure 11A:
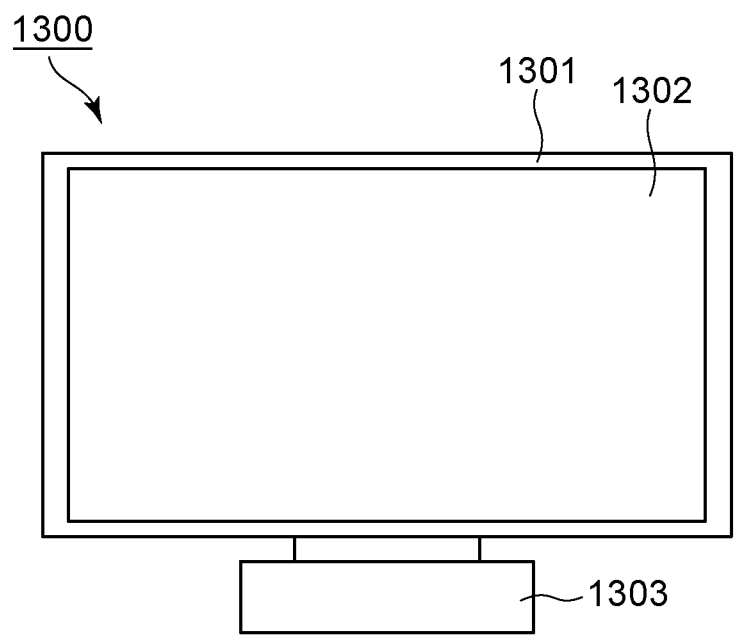
FIG. 11A is a schematic view showing an example of a display apparatus according to an embodiment of the present disclosure.
Figure 11B:
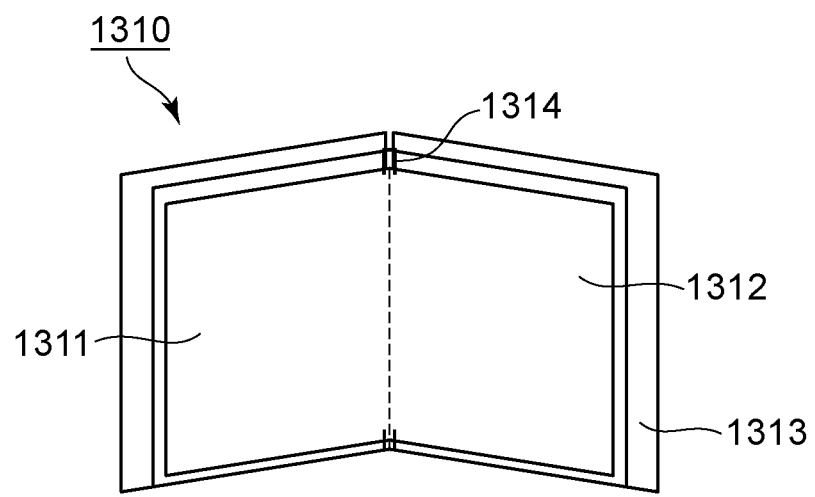
FIG. 11B is a schematic view showing an example of a foldable display apparatus.

FIG. 11A and FIG. 11B are schematic views showing examples of the display apparatus according to the present embodiment. FIG. 11A is a display apparatus, such as a television monitor or a PC monitor. A display apparatus 1300 includes a frame 1301 and a display unit 1302. The light emitting apparatus according to any one of the embodiments may be used in the display unit 1302.

The display apparatus 1300 includes a base 1303 that supports the frame 1301 and the display unit 1302. The base 1303 is not limited to the mode of FIG. 11A. The bottom side of the frame 1301 may serve as a base.

The frame 1301 and the display unit 1302 may be curved. The radius of curvature may be greater than or equal to 5000 mm and less than or equal to 6000 mm.

FIG. 11B is a schematic view showing another example of the display apparatus according to the present embodiment. A display apparatus 1310 of FIG. 11B is arranged to be foldable, and is a so-called foldable display apparatus. The display apparatus 1310 includes a first display unit 1311, a second display unit 1312, a housing 1313, and a folding point 1314. The first display unit 1311 and the second display unit 1312 each may include the light emitting apparatus according to any one of the embodiments. The first display unit 1311 and the second display unit 1312 may make up a seamless one display apparatus. The first display unit 1311 and the second display unit 1312 may be separated at the folding point. The first display unit 1311 and the second display unit 1312 may respectively display different images or the first and second display units 1311, 1312 may display one image.

Figure 12A:
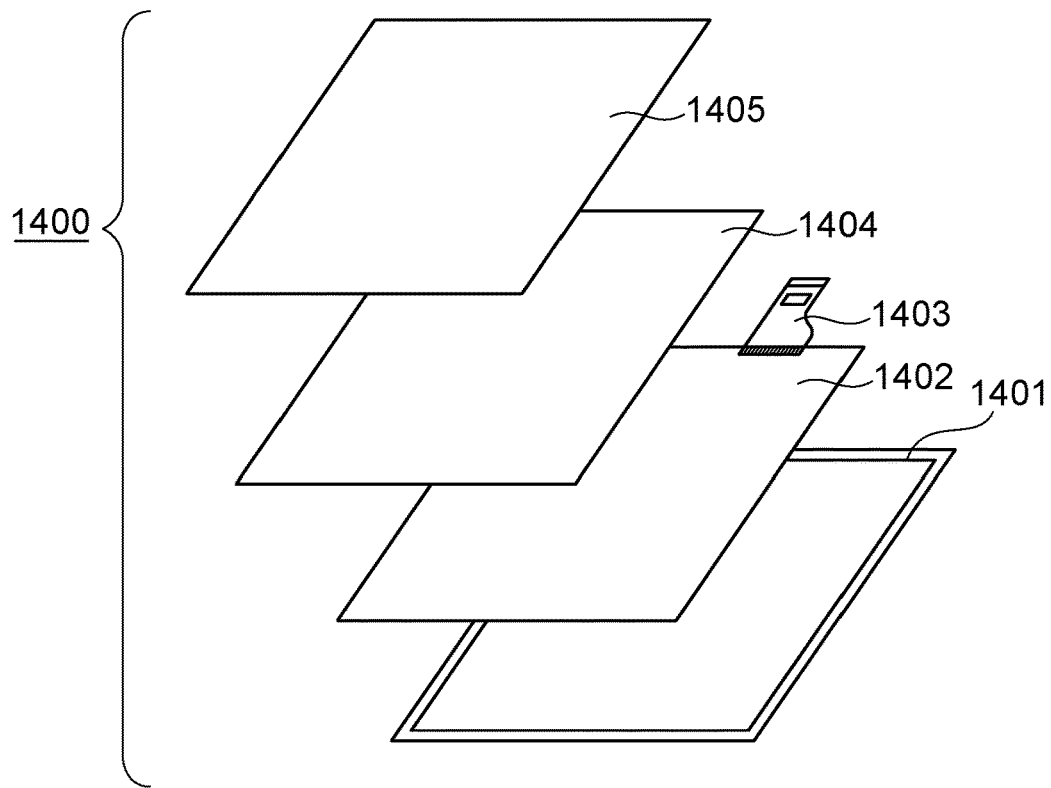
FIG. 12A is a schematic view showing an example of an illumination apparatus according to an embodiment of the present disclosure.

FIG. 12A is a schematic view showing an example of an illumination apparatus according to the present embodiment. An illumination apparatus 1400 may include a housing 1401, a light source 1402, a circuit board 1403, an optical filter 1404, and a light diffusion unit 1405. The light source 1402 may include organic light emitting elements according to the present embodiment. The optical filter 1404 may be a filter that improves the color rendering property of the light source 1402. The light diffusion unit 1405 is capable of effectively diffusing light from the light source 1402 for illumination or the like to bring light to a wide range. The optical filter 1404 and the light diffusion unit 1405 may be provided on a light emission side of illumination. Where necessary, a cover may be provided at an outermost part.

The illumination apparatus 1400 is an apparatus that illuminates, for example, a room. The illumination apparatus 1400 may emit light in any one of white color, daylight color, and other colors from blue to red. The illumination apparatus 1400 may include a light modulating circuit that modulates light of any one of those colors. The illumination apparatus may include organic light emitting elements according to the embodiment of the present disclosure and a power supply circuit connected to those elements. The power supply circuit is a circuit that converts alternating-current voltage to direct-current voltage. White has a color temperature of 4200K, and daylight color has a color temperature of 5000K. The illumination apparatus 1400 may include a color filter.

The illumination apparatus 1400 according to the present embodiment may include a heat radiation unit. The heat radiation unit is to release heat inside the apparatus to the outside of the apparatus and may be made of a metal having a high specific heat, liquid silicon, or the like.

Figure 12B:
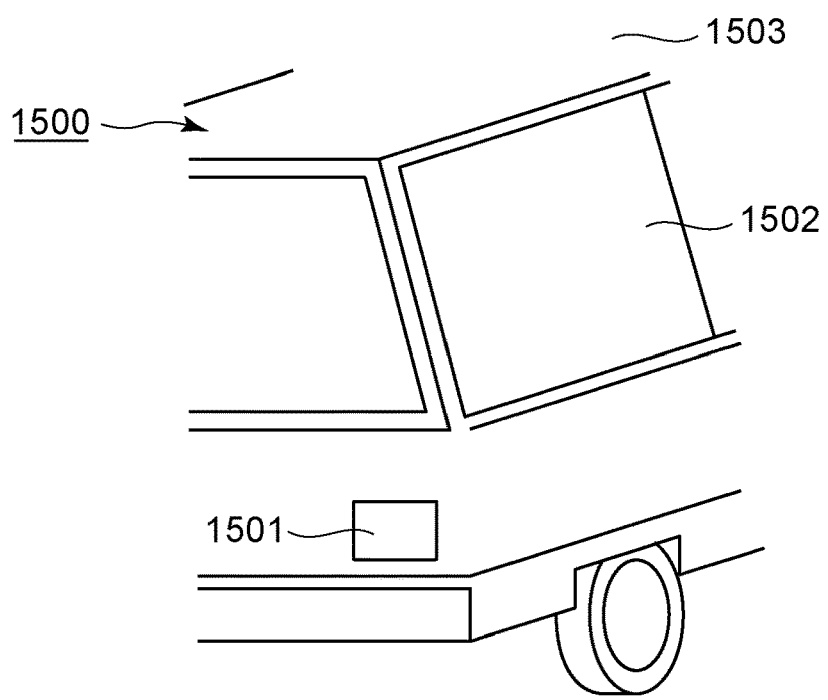
FIG. 12B is a schematic view showing an example of an automobile equipped with a vehicle lamp according to an embodiment of the present disclosure.

FIG. 12B is a schematic view of an automobile that is an example of a moving object according to the present embodiment. The automobile includes a tail lamp that is an example of a lamp. The automobile 1500 includes the tail lamp 1501 and may be configured to, when brake operation or the like is performed, turn on the tail lamp 1501.

The tail lamp 1501 may include the organic light emitting elements according to the present embodiment. The tail lamp 1501 may include a protective member that protects the organic light emitting elements. The protective member may be made of any material as long as the protective member has a high strength to a certain extent and is desirably made of polycarbonate or the like. A furan dicarboxylic acid derivative, an acrylonitrile derivative, or the like may be mixed with polycarbonate.

The automobile 1500 may include a body 1503 and windows 1502 fixed to the body 1503. The windows 1502 other than windows for viewing the front and rear of the automobile 1500 each may be a transparent display. The transparent display may include the organic light emitting elements according to the present embodiment. In this case, the constituent materials of the electrodes and the like of each organic light emitting element are made up of transparent members.

The moving object according to the present embodiment may be a ship, an airplane, a drone, or the like. The moving object may include a body and a lamp provided on the body. The lamp may emit light for informing a position of the body. The lamp includes the organic light emitting elements according to the present embodiment.

Application examples of the display apparatus of each of the above-described embodiments will be described with reference to FIG. 13A and FIG. 13B. The display apparatus is applicable to a wearable system as a wearable device, such as smartglasses, an HMD, and a smart contact lens. An image pickup and display apparatus used in such application examples includes an image pickup apparatus capable of performing photoelectric conversion of visible light and a display apparatus capable of emitting visible light.

Figure 13A:
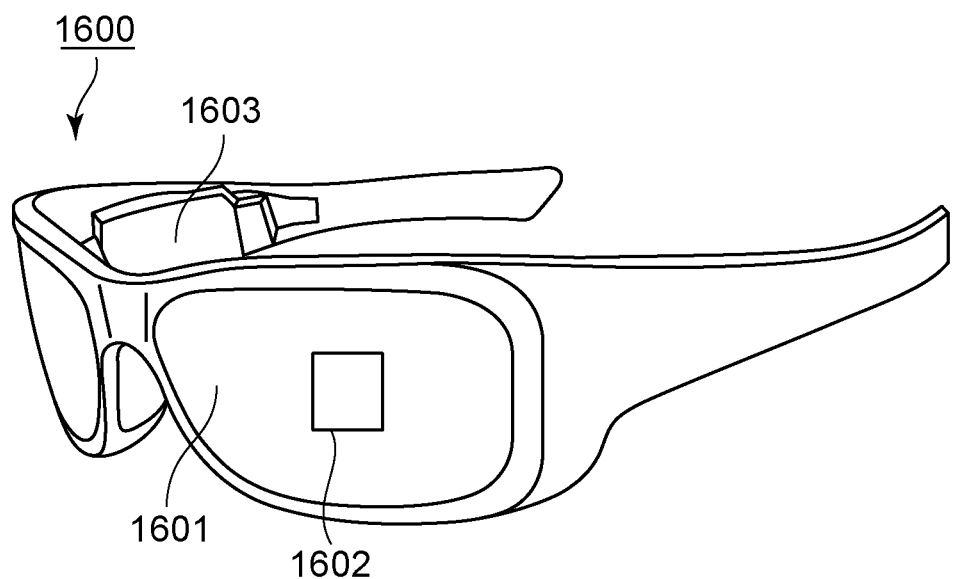
FIG. 13A and FIG. 13B show examples of smartglasses according to an embodiment of the present disclosure.

FIG. 13A illustrates glasses 1600 (smartglasses) according to one application example. An image pickup apparatus 1602, such as a CMOS sensor and an SPAD, is provided on the surface side of a lens 1601 of the glasses 1600. In addition, the display apparatus of any one of the above-described embodiments is provided on the back surface side of the lens 1601.

The glasses 1600 further include a controller 1603. The controller 1603 functions as a power supply to supply electric power to the image pickup apparatus 1602 and the display apparatus of any one of the embodiments. The controller 1603 controls the operations of the image pickup apparatus 1602 and the display apparatus. An optical system for gathering light to the image pickup apparatus 1602 is formed in the lens 1601.

Figure 13B:
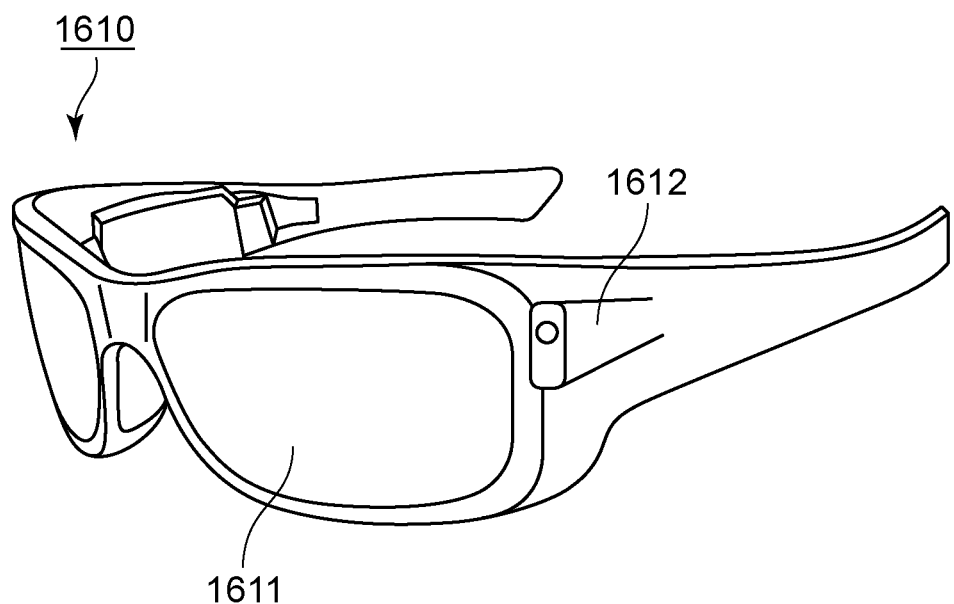

FIG. 13B illustrates glasses 1610 (smartglasses) according to one application example. The glasses 1610 include a controller 1612, and an image pickup apparatus corresponding to the image pickup apparatus 1602, and the display apparatus are installed in the controller 1612. The image pickup apparatus in the controller 1612 and an optical system for projecting light emitted from a display apparatus are formed in a lens 1611, and an image is projected onto the lens 1611. The controller 1612 functions as a power supply to supply electric power to the image pickup apparatus and the display apparatus and also controls the operations of the image pickup apparatus and the display apparatus. The controller 1612 may include a line-of-sight detection unit that detects the line of sight of a wearer. Infrared radiation may be used to detect the line of sight. An infrared emitting unit emits infrared light to the eye of a user gazing at a display image. Infrared light emitted and reflected from the eye is detected by an image pickup unit including a light receiving element. Thus, a picked-up image of the eye is obtained. A reducer that reduces light from the infrared emitting unit to the display unit in plan view is provided, so a decrease in image quality is reduced.

The line-of-sight of the user toward the display image is detected from the picked-up image of the eye, obtained through image pickup using infrared light. A selected known technique may be applied to line-of-sight detection using a picked-up image of an eye. As an example, a line-of-sight detection method based on a Purkinje image caused by reflection of irradiation light on a cornea may be used.

More specifically, a line-of-sight detection process based on a pupil-cornea reflection method is performed. A line-of-sight vector indicating the orientation (rotational angle) of the eye is calculated in accordance with the pupil image contained in a picked-up image of the eye and a Purkinje image by using the pupil-cornea reflection method. Thus, the line of sight of a user is detected.

A display apparatus according to an embodiment of the present disclosure may include an image pickup apparatus having a light receiving element and may control a display image of the display apparatus in accordance with information about the line of sight of a user from the image pickup apparatus.

Specifically, the display apparatus determines a first field of view area at which the user gazes and a second field of view area other than the first field of view area in accordance with line-of-sight information. A first field of view area and a second field of view area may be determined by the controller of the display apparatus or a first field of view area and a second field of view area determined by an external controller may be received. In a display area of the display apparatus, a display resolution of the first field of view area may be controlled so as to be higher than a display resolution of the second field of view area. In other words, the resolution of the second field of view area may be made lower than the resolution of the first field of view area.

A display area may include a first display area and a second display area different from the first display area, and an area having a higher priority may be determined in accordance with line-of-sight information from among the first display area and the second display area. A first field of view area and a second field of view area may be determined by the controller of the display apparatus or a first field of view area and a second field of view area determined by an external controller may be received. The resolution of an area having a higher priority may be controlled so as to be higher than the resolution of an area other than the area having a higher priority. In other words, the resolution of an area having a relatively lower priority may be decreased.

AI may be used to determine a first field of view area or an area having a higher priority. AI may be a model configured to estimate an angle of a line of sight and a distance to an object ahead of the line of sight from an image of an eye by using the images of the eye and corresponding directions in which the eye of the image is actually viewing as training data. The display apparatus, or the image pickup apparatus, or an external apparatus may include an AI program. When the external apparatus includes an AI program, the AI program is transmitted to the display apparatus via communication.

When display control is performed in accordance with line-of-sight detection, it is suitably applied to smartglasses further including an image pickup apparatus that picks up an outside. The smartglasses are capable of displaying picked-up outside information in real time.

As described above, with an apparatus using the organic light emitting elements according to the present embodiment, stable display can be performed even for a long time with good image quality.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2020-033818, filed Feb. 28, 2020, which is hereby incorporated by reference herein in its entirety.

What is claimed is:

1. A light emitting apparatus comprising:
a substrate having a main surface;
a first light emitting element and a second light emitting element disposed on the main surface, wherein light emitted from the first light emitting element is emitted from a first area and light emitted from the second light emitting element is emitted from a second area;
a first lens into which light emitted from the first area enters; and
a second lens into which light emitted from the second area enters, wherein
in a direction parallel to the main surface, a distance between a middle point of the second area and a vertex of the second lens is greater than a distance between a middle point of the first area and a vertex of the first lens, and
the second area is smaller than the first area.

2. The light emitting apparatus according to claim 1, further comprising:
a third light emitting element emitting light from a third area; and
a third lens into which light emitted from the third area enters, wherein
in the direction parallel to the main surface, a distance between a middle point of the third area and a vertex of the third lens is greater than the distance between the middle point of the second area and the vertex of the second lens, and
the third area is smaller than the second area.

3. The light emitting apparatus according to claim 1, wherein
the first light emitting element includes a lower electrode, a light emitting layer, and an upper electrode in a stated order and includes a first insulating layer and a second insulating layer respectively covering both ends of the lower electrode, and
the middle point of the first area is a middle point of a line segment connecting an end of the first insulating layer and an end of the second insulating layer.

4. The light emitting apparatus according to claim 1, wherein the first lens and the second lens are provided closer to a light extraction side of the light emitting apparatus than the first light emitting element and the second light emitting element.

5. The light emitting apparatus according to claim 1, wherein
a light emitting area of the light emitting apparatus includes a first light emitting area, and a second light emitting area surrounding the first light emitting area,
the first light emitting element is disposed in the first light emitting area, and
the second light emitting element is disposed in the second light emitting area.

6. The light emitting apparatus according to claim 1, wherein
the first area and the second area each have a polygonal shape, and
at least one side of the polygonal shape of the second area is disposed on an inner side as compared to the polygonal shape of the first area.

7. The light emitting apparatus according to claim 6, wherein
two sides of the polygonal shape of the second area are disposed on the inner side as compared to the polygonal shape of the first area, and
the two sides are opposite to each other among sides of the polygonal shape.

8. The light emitting apparatus according to claim 6, wherein
the first light emitting element is contained in a first light emitting area of the light emitting apparatus,
the second light emitting element is contained in a second light emitting area surrounding the first light emitting area,
one side of the polygonal shape of the second area is disposed on the inner side as compared to the polygonal shape of the first area, and
the one side is closest to the first light emitting area among sides of the polygonal shape.

9. The light emitting apparatus according to claim 1, wherein
a light emitting area of the light emitting apparatus includes a first light emitting area, and a second light emitting area surrounding the first light emitting area,
the first light emitting element is disposed in the first light emitting area, the second light emitting element is disposed in the second light emitting area, the light emitting apparatus further comprises:
a second color filter into which light emitted from the second area enters;
a fourth light emitting element disposed next to the second light emitting element and emitting light from a fourth area; and
a fourth color filter into which light emitted from the fourth area enters and arranged to transmit light having a wavelength different from a wavelength of light that the second color filter transmits, and
the second color filter and the fourth color filter are disposed in a line segment connecting a vertex of the second lens and the fourth area.

10. The light emitting apparatus according to claim 1, wherein
where a height of the second lens is h, a radius of the second lens is r, a refractive index of the second lens is n,
an angle of light emitted from the second area is θ1,
an angle of the second lens at a point at which light emitted from the second area is refracted by the second lens is a and an angle of light refracted is θ2,
an amount of shift of a vertex of the second lens from a center of the second area is Xshift, and
a distance from the second area to the second lens is L,
a width X of the second area is expressed as follows:

$X = r - h \times \tan[\sin^{-1}\{\sin(\theta 2 + \alpha)/n\} - \alpha]$, and $\tan^{-1}(X\text{shift}/h + L) > \theta 1$.

11. A display apparatus comprising:
the light emitting apparatus according to claim 1; and
a control unit arranged to control display of the light emitting apparatus.

12. An image pickup apparatus comprising:
an optical unit having a plurality of lenses;
an image pickup device arranged to receive light passing through the optical unit; and
a display unit arranged to display an image picked up by the image pickup device, wherein
the display unit includes the light emitting apparatus according to claim 1.

13. An electronic device comprising:
a display unit including the light emitting apparatus according to claim 1;
a housing on which the display unit is provided; and
a communication unit provided in the housing and arranged to communicate with an external source.

14. An illumination apparatus comprising:
a light source including the light emitting apparatus according to claim 1; and
a light diffusion unit or an optical film arranged to transmit light emitted from the light source.

15. A moving object comprising:
a lamp including the light emitting apparatus according to claim 1; and
a body on which the lamp is provided.

16. A light emitting apparatus comprising:
a substrate having a main surface;
a first light emitting element disposed on the main surface; and
a plurality of second light emitting elements disposed on the main surface so as to surround the first light emitting element in plan view in a direction perpendicular to the main surface, wherein each of the first light emitting element and the plurality of second light emitting elements includes a lower electrode, a light emitting layer, and an upper electrode from a side adjacent to the substrate in a stated order and includes an insulating layer covering an end of the lower electrode,
a first area from which light emitted from the first light emitting element is emitted is defined by the insulating layer of the first light emitting element,
a second area from which light emitted from each of the second light emitting elements is emitted is defined by the insulating layer of the second light emitting element, and
the second area is smaller than the first area.

17. The light emitting apparatus according to claim 16, wherein the first light emitting element and each second light emitting element emit light in a same color.

18. The light emitting apparatus according to claim 16, further comprising:
a first lens into which light emitted from the first area enters; and
a second lens into which light emitted from the second area of a corresponding one of the second light emitting elements enters, wherein
in a direction parallel to the main surface, a distance between a middle point of the second area and a vertex of the corresponding second lens is greater than a distance between a middle point of the first area and a vertex of the first lens.

19. A display apparatus comprising:
the light emitting apparatus according to claim 16; and
a control unit arranged to control display of the light emitting apparatus.

20. An image pickup apparatus comprising:
an optical unit having a plurality of lenses;
an image pickup device arranged to receive light passing through the optical unit; and
a display unit arranged to display an image picked up by the image pickup device, wherein
the display unit includes the light emitting apparatus according to claim 16.

21. An electronic device comprising:
a display unit including the light emitting apparatus according to claim 16;
a housing on which the display unit is provided; and
a communication unit provided in the housing and arranged to communicate with an external source.

22. An illumination apparatus comprising:
a light source including the light emitting apparatus according to claim 16; and
a light diffusion unit or an optical film arranged to transmit light emitted from the light source.

23. A moving object comprising:
a lamp including the light emitting apparatus according to claim 16; and
a body on which the lamp is provided.

24. A light emitting apparatus comprising:
a substrate having a main surface;
a first light emitting element and a second light emitting element disposed on the main surface, wherein light emitted from the first light emitting element is emitted from a first area and light emitted from the second light emitting element is emitted from a second area;
a first optical member into which light emitted from the first area enters; and
a second optical member into which light emitted from the second area enters, wherein in a direction parallel to the main surface, a distance between a middle point of the second area and a middle point of the second optical member is greater than a distance between a middle point of the first area and a middle point of the first optical member, and the second area is smaller than the first area.

25. The light emitting apparatus according to claim 24, wherein the first and second optical members are respectively a first lens and a second lens, and the middle points of the first and second optical members are respectively vertexes of the first and second lenses.

\* \* \* \* \*